United States Patent

Igarashi et al.

(10) Patent No.: US 9,172,007 B2
(45) Date of Patent: Oct. 27, 2015

(54) METHOD OF MANUFACTURING LIGHT EMITTING DEVICE AND SPRAY COATING MACHINE

(71) Applicant: NICHIA CORPORATION, Tokushima (JP)

(72) Inventors: Takayuki Igarashi, Yokohama (JP); Satoshi Shirahama, Yokohama (JP)

(73) Assignee: NICHIA CORPORATION, Anan-Shi (JP)

(*) Notice: Subject to any disclaimer, the term of this patent is extended or adjusted under 35 U.S.C. 154(b) by 123 days.

(21) Appl. No.: 14/138,899

(22) Filed: Dec. 23, 2013

(65) Prior Publication Data

US 2014/0186980 A1     Jul. 3, 2014

(30) Foreign Application Priority Data

Dec. 26, 2012   (JP) ................. 2012-283417

(51) Int. Cl.
| | |
|---|---|
| *H01L 21/00* | (2006.01) |
| *H01L 33/50* | (2010.01) |
| *H01L 33/52* | (2010.01) |

(52) U.S. Cl.
CPC ............. *H01L 33/50* (2013.01); *H01L 33/52* (2013.01); *H01L 2933/0025* (2013.01); *H01L 2933/0041* (2013.01)

(58) Field of Classification Search
CPC . H01L 33/50; H01L 33/52; H01L 2933/0025; H01L 2933/0041
USPC .............................. 438/27, 28, 29
See application file for complete search history.

(56) References Cited

U.S. PATENT DOCUMENTS

| | | | |
|---|---|---|---|
| 8,940,561 B2 * | 1/2015 | Donofrio et al. ................. 438/26 |
| 2008/0076198 A1 | 3/2008 | Park et al. | |
| 2012/0264236 A1 * | 10/2012 | Chang et al. ....................... 438/7 |
| 2015/0024516 A1 * | 1/2015 | Seibel et al. ....................... 438/7 |
| 2015/0155446 A1 * | 6/2015 | Stoll et al. ....................... 438/29 |

FOREIGN PATENT DOCUMENTS

| | | |
|---|---|---|
| JP | 9-152245 | 6/1997 |
| JP | 11-49805 | 2/1999 |
| JP | 2008-78659 | 4/2008 |
| WO | WO 2012/086483 A1 | 6/2012 |

* cited by examiner

*Primary Examiner* — Kevin M Picardat
(74) *Attorney, Agent, or Firm* — Foley & Lardner LLP

(57) ABSTRACT

A method of manufacturing a light emitting device, using a spray coating method, a fluorescent material can be easily adhered on corner portions and side surfaces of an LED chip, a lens-shaped light transmissive resin member surface, an optical lens surface, etc., and a spray coating machine used in the method. The method includes mounting an LED chip on a substrate member, applying a spray coating to a coating object including the LED chip by spraying a powder-containing solution. The applying a spray coating is performed such that a powder-containing solution is sprayed through a solution nozzle arranged above the coating object, as a spray direction of the powder-containing solution indicating a central axis, while using at least one gas nozzle arranged in a surrounding relationship to the central axis, spraying a gas toward the central axis to alter the direction of the spray made of the powder-containing solution.

20 Claims, 8 Drawing Sheets

METHOD OF MANUFACTURING LIGHT EMITTING DEVICE AND SPRAY COATING MACHINE

CROSS-REFERENCE TO RELATED APPLICATION

This application is based on application No. 2012-283417 filed in Japan on Dec. 26, 2012, the content of which is incorporated hereinto by reference.

BACKGROUND OF THE INVENTION

1. Field of the Invention

The present disclosure relates to a method of manufacturing a light emitting device which employs a light emitting element such as an LED (Light Emitting Diode), particularly, to a method of manufacturing a light emitting device in which a fluorescent material etc., can be disposed uniformly, and to a spray coating machine used in the method.

2. Description of Related Art

In the general lighting market such as light bulbs for general lighting, middle and small size LCDs, large size LCDs, street lights, signal lights, and lighting for automobiles, demand for LEDs in such lighting fields is expanding with the improvement in luminous efficiency of LEDs. Typically, an LED generates white light by using an LED chip and a fluorescent material which converts a wavelength of light and is disposed around the LED chip. Examples of the method of disposing the fluorescent material include a potting method in which a liquid resin containing a fluorescent material is disposed around an LED chip and is hardened, and an electrodeposition method in which a fluorescent material is arranged around an LED chip by using an electrophoretic technique.

However, in such a potting method, a mixture of a fluorescent material and a liquid resin is applied by potting, then, the fluorescent material is allowed to precipitate spontaneously by gravity, in which, the fluorescent material is difficult to be precipitated on the corner portions and the side surfaces of the LED chip, so that a lesser thickness of the fluorescent layer may result. Such an electrodeposition method employs an electrophoretic technique, so that the fluorescent material can be attached to the corner portions and the side surfaces of the LED chip, but depends on the particle size of the fluorescent material, uneven electrophoretic behavior may occur and/or the thickness of the fluorescent material may be difficult to control.

The ratio of the wavelength-converted light by the fluorescent material varies depending on the optical path length of the light emitted from the LED chip passing through the fluorescent material layer, so that a short optical path length (i.e. a thin fluorescent material layer) increases a blue component attributes to the light emitted from the LED chip, and a long optical path length (i.e. a thick fluorescent material layer) increases a yellow component attributes to the wavelength-converted light. But in the two methods as described above, controlling of the thickness of the fluorescent material layer is not an easy task, which may result in irregular color in the emission due to disruption of a balance between the blue component and the yellow component, or may result in irregular coloration such as a yellow ring in the second optical system.

Also, generally in the case where a white light is obtained by mixing a fluorescent material in a sealing member (light transmissive resin) of an LED chip, optical output power generally tend to decrease due to dispersion of the light in a long optical path passing the fluorescent material. In recent years, a lower cost in the manufacturing is in demand for general lighting and the solution for those problems without increasing a peculiar step in manufacturing is regarded as important. Accordingly, in order to solve the problems described above, a method of forming a thin-layer of a fluorescent material has been proposed in which a coating agent containing a fluorescent material is coated on the surface of the sealing member by using a spray coating method to form a thin fluorescent material layer (see, for example, JP 2008-78659A).

In the spray coating method proposed in JP 2008-78659A, a spray-coating is applied from directly above a coating object (an LED chip encapsulated in a convex lens shape according to JP 2008-78659A) perpendicularly to the coating object, where a fluorescent material containing coating member is sprayed by using a conical swirling spray method. In which, the coating material containing a fluorescent material is sprayed in a conical swirling spray pattern to deposit a thin layer of the fluorescent material. However, in the case where a fluorescent material is applied by using the spray coating method proposed in JP 2008-78659A, due to a limitation in the spraying angle of the fluorescent material containing coating agent from the spray nozzle, uniform coating thickness is difficult to obtain particularly on the side surfaces (perpendicular surfaces of the coating objects).

Further, the spray nozzle used in the spray coating method proposed in JP 2008-78659A is placed directly above the coating object as described above. Accordingly, the coating range of the fluorescent material-containing coating agent applied with the spray nozzle on a coating object is determined generally by the machine parameters such as the diameter of the spray nozzle, the height of the spray nozzle with respect to the coating object, and the spraying pressure. Therefore, in the case where the coating object is larger than the coating range, the position of the spray nozzle and the parameters are needed to be adjusted to the coating object, so that optimum coating conditions for applying a fluorescent material on a coating object with a uniform coating at a desired thickness have not easily obtained.

SUMMARY OF THE INVENTION

The present invention is devised to solve the problems as described above, and is aimed to provide a method of manufacturing a light emitting device in which by the use of a spray coating method, a fluorescent material can be deposited with ease on a corner portion and a side surface of an LED chip, a surface of light transmissive resin member having a lens shape, a surface of an optical lens, or the like, and also to provide a spray coating machine used in the method.

In order to solve the problems described above, a method of manufacturing a light emitting device which at least includes an LED chip and a substrate member disposed with the LED chip, the method includes mounting an LED chip on a substrate member, applying a spray coating to a coating object including the LED chip by spraying a powder-containing solution containing a powder by using a spray. In the applying spray coating, the powder-containing solution which may also be called a slurry is sprayed through a solution nozzle placed over the coating object, as a spraying direction of the powder-containing solution indicating a central axis, with using a gas nozzle placed in a surrounding relationship to the central axis, spraying a gas toward the central axis to alter the direction of the spray made of the powder-containing solution.

Also, in order to solve the problems described above, a spray coating machine according to embodiments of the present invention is to spray a fluorescent material-containing solution to an LED chip. The spray coating machine includes a solution nozzle placed over the LED chip to spray a fluorescent material-containing solution over the LED chip, and a gas nozzle placed in a surrounding relationship to the central axis which is the spraying direction of the spray made of the fluorescent material-containing solution, to spray a gas toward the central axis to alter an direction of the spraying made of fluorescent material-containing solution.

According to the method of manufacturing a light emitting device and a spray coating device used in the method according to the embodiments, spraying of spray coating is angled by using a gas nozzle so that a fluorescent material can be adhered efficiently on a coating object (corner portions or side surfaces of an LED chip, a surface of light transmissive resin member having a lens shape, a surface of optical lens etc.). Therefore, the method of manufacturing a light emitting device and a spray coating device used in the method according to the embodiments can facilitate adjustment of the thickness of the fluorescent material, which allows controlling of the thickness of the fluorescent material inconformity to the light-distribution intensity of the LED chip to obtain a most suitable optical path length. Thus, generation of uneven color in the emission can be prevented.

BRIEF DESCRIPTION OF THE DRAWINGS

FIGS. 2A to 2C are schematic diagrams for illustrating applying a spray coating according to a method of manufacturing alight emitting device according to an embodiment of the present invention, in which FIG. 2A shows an arrangement of solution nozzle, FIG. 2B shows an installation angle of a air nozzle, and FIG. 2C shows an spray angle of a fluorescent material-containing solution while using the air nozzle.

FIGS. 3A and 3B are schematic diagrams for illustrating applying a spray coating according to a method of manufacturing alight emitting device according to an embodiment of the present invention, in which FIG. 3A shows a range of movement of a solution nozzle, and FIG. 3B shows a range of movement of a solution nozzle and an arrangement of an air nozzle.

FIGS. 4A to 4C are schematic diagrams for illustrating applying a spray coating according to a method of manufacturing alight emitting device according to an embodiment of the present invention, in which FIG. 4A is a diagram showing a state of fluorescent material-containing solution before spraying a gas from a gas nozzle, FIG. 4B is a diagram showing a state of the fluorescent material-containing solution with spraying a gas from the gas nozzle, and FIG. 4C is an enlarged view of a part of FIG. 4B.

DETAILED DESCRIPTION OF THE EMBODIMENTS

Figure 1:
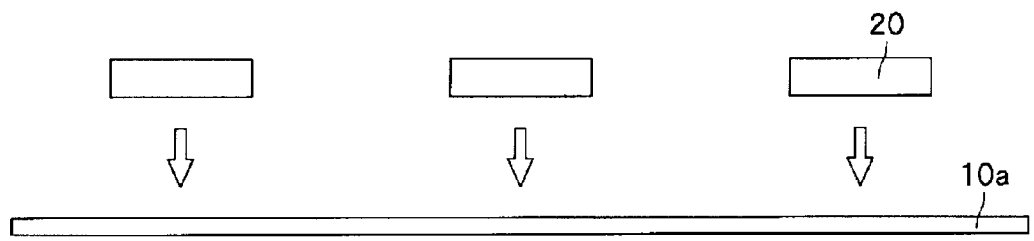
FIG. 1 is a schematic diagram illustrating mounting an LED chip in a method of manufacturing a light emitting device according to the present embodiment.

Next, a method of manufacturing a light emitting device and a spray coating machine used in the method according to an embodiment of the present invention will be described with reference to the drawings. In the description below, first, a method of manufacturing light emitting device according to an embodiment will be described, then, an overall structure of a light emitting device manufactures according to the method will be described. In the description below, structure of a spray coating machine will be described while describing the method of manufacturing a light emitting device. The drawings referred in the description below are for schematic illustration of the embodiments and scale and positional relationships of the members may be occasionally exaggerated, or a part of the members may be occasionally omitted. Members same as or similar to those of this invention are usually attached with the same designation and the same reference numerals, and their description will be appropriately omitted.

Method of Manufacturing Light Emitting Device

Now, a method of manufacturing a light emitting device 1 according to an embodiment of the present invention will be described with reference to FIG. 1 to FIG. 7 (refer also to FIG. 8 when appropriate). The method of manufacturing the light emitting device 1 in the embodiment includes mounting an LED chip, applying spray coating, applying resin covering, and dicing. In the following, as an example of a method of manufacturing the light emitting device 1 using a flip chip type LED chip 20 will be described, but in the case where a surface-mount type LED chip to be used, appropriately similar operation can be performed except that wire bonding is performed after mounting the LED chip. The method of manufacturing the light emitting device 1 may also be performed such that disposing a mask after mounting the LED chip as described above, and removing the mask after applying spray coating.

The mounting of the LED chip is, as shown in FIG. 1, performed by mounting the LED chip 2 on a substrate member 10a prior to dicing. Electrodes for mounting the LED chips 20 are disposed in a pattern on the substrate member 10a prior to dicing. The LED chips 20 are mounted thereon and electrically connected. At this time, the flip chip type LEDs 20 are connected typically by eutectic bonding using a metal-based paste or by pressure bonding using an Au bump. In the case where surface-mount type LED chips to be used, an epoxy resin, a silicone resin, or the like can be used to fix the chips and electric connection with the substrate member 10 can be established by using electrically conductive wires.

In FIG. 1, only three LED chips 20 are shown, but the number of the LED chips 20 to be mounted on the substrate member 10a prior to dicing is not specifically limited.

In the spray coating, as shown in FIGS. 2A to 2C FIG. 4, a fluorescent material-containing solution is sprayed on the surfaces of an LED chip. In the following, spray coating of a fluorescent material-containing solution in which a fluorescent material is used as a powder in a powder-containing solution will be described, but an inorganic compound such as an inorganic filler material may also be used as the powder. Also in the following, the case where the coating object of the fluorescent material-containing solution with the use of the spray coating machine SP is an LED chip 20 will be described, but as will be described below, the coating object may be a light transmissive resin member (see FIG. 10 and FIG. 11).

In the spray coating, for example, a spray coating machine SP is used to spray a fluorescent material-containing solution to the LED chip 20. The fluorescent material-containing solution sprayed from the spray coating machine radiates out toward the LED chip 20 which is the coating object. The present inventors found that the status of adhesion of the fluorescent material-containing solution on the corner portions and side surfaces of the LED chip 20 differ according to the radiated angle. Thus, the present inventors conducted scrutinized examination on this phenomenon and found that altering the spraying angle of the fluorescent material-containing solution itself by using a gas nozzle 52 allows for efficient and easy adhesion of the fluorescent material on the corner portions and side surfaces of the LED chip 20. A spray coating machine SP used in spray coating will be described below.

Structure of Spray Coating Machine

Figure 2A:
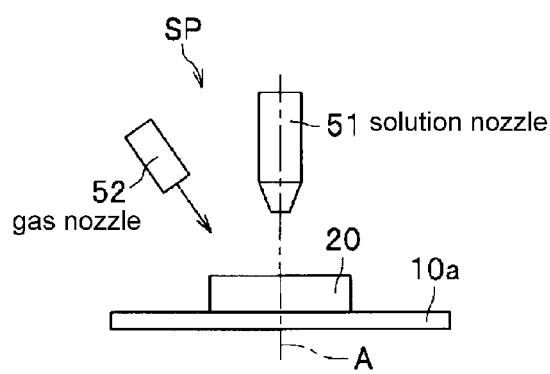

The spray coating machine SP is to apply a directed spray of a fluorescent material-containing solution to the LED chip 20 on the substrate member 10a. The spray coating machine SP includes, for example as shown in FIG. 2A, a solution nozzle 51 and a gas nozzle 52. The spray coating machine SP shown in FIG. 2A is a schematic diagram and only a major portion of the structure is plainly shown.

The solution nozzle 51 is to spray a fluorescent material-containing solution which contains a fluorescent material to the LED chip 20. The solution nozzle 51 can be, as shown in FIG. 2A, placed above the LED chip 20 and perpendicular to the surface of the LED chip 20 on which the fluorescent material coating to be applied. With this arrangement, the solution nozzle 51 sprays the fluorescent material-containing solution in a direction from above to below with respect to the LED chip 20. Further, the solution nozzle 51 can be configured to move to and fro (in x-direction and y-direction) with respect to the spray coating machine SP without inhibition, so that the fluorescent material-containing solution can be sprayed on each of the plurality of LED chips 20 mounted on the substrate member 10a before dicing.

The fluorescent material-containing solution sprayed from the solution nozzle 51 is, for example, made of a fluorescent material and a binder such as a silicone resin or an epoxy resin and an organic solvent such as n-hexane, n-heptane, toluene, or acetone. The mixing ratio of the fluorescent material, the binder, and the organic solvent can be appropriately selected depending on the intended use.

Figure 2B:
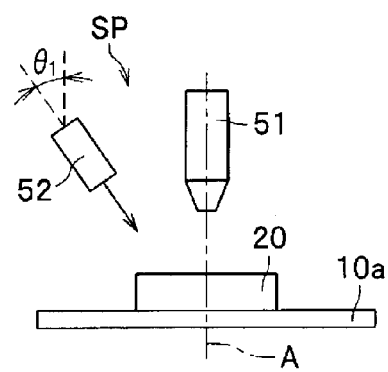
Figure 2C:
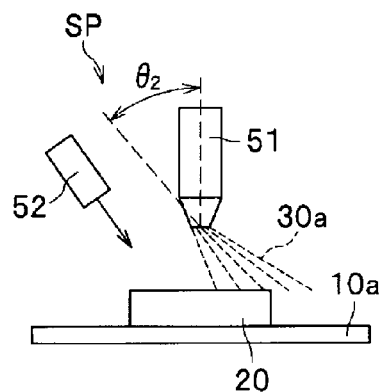

The gas nozzle 52 is to spray a gas to the spray of fluorescent material-containing solution as it is being sprayed from the solution nozzle 51. The gas nozzle 52 can be, as shown in FIG. 2A, placed above (at a higher position with respect to) the LED chip 20 and as a spraying direction of the fluorescent material-containing solution sprayed through the solution nozzle 51 described above indicating a central axis A, the gas nozzle is also placed around (in the vicinity of) the central axis A. The gas nozzle 52 is, as shown in FIG. 2B, placed at an angle $e_1$ with respect to the central axis A. With this arrangement, as shown in FIG. 2C, the gas nozzle 52 sprays a gas at the installation angle $\theta_1$ described above, to the spray discharged through the solution nozzle 51. Thus, the direction of the spray can be altered and the fluorescent material-containing solution 30a can be sprayed at an angle. The term "spray" refers to the fluorescent material-containing solution 30a in a state after discharged from the solution nozzle 51.

The installation angle $\theta_1$ of the gas nozzle 52 can be, for example, in a range of 10° to 45° with respect to the central axis A, and a gas is sprayed toward the central axis A at an angle of 10° to 45°. With this arrangement, the direction of the spray made of the fluorescent material-containing solution 30a can be easily angled. The spray angle $\theta_2$ (the angle after altering the direction of spray) with the use of the gas nozzle 52 is determined by the installation angle $\theta_1$ of the gas nozzle 52, the height of the gas nozzle 52, and the pressure of the gas. Examples of the gas sprayed from the gas nozzle 52 include air, nitrogen gas, oxygen gas, and argon gas.

Figure 3A:
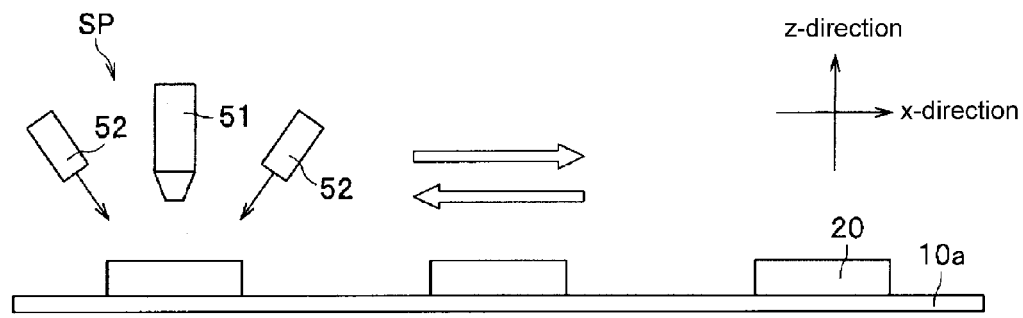
Figure 3B:
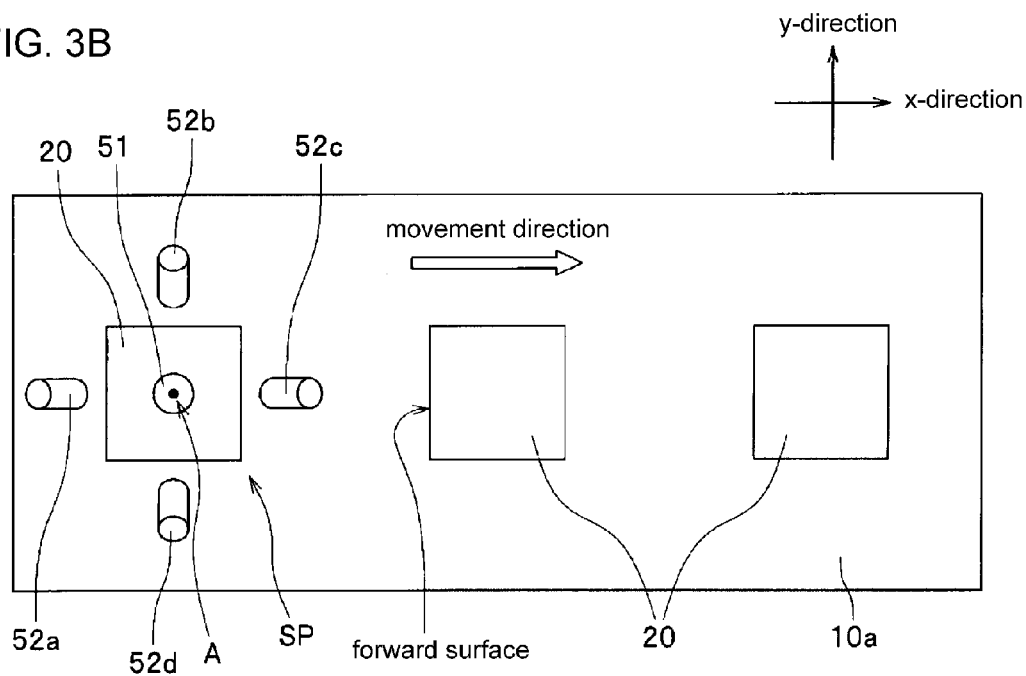

The gas nozzles 52 are placed around the solution nozzle 51, as shown in FIG. 3A and FIG. 3B. That is, in the present embodiment, a total of four of the gas nozzles 52 are, in a top view as shown in FIG. 3B, placed one each at left, right, front, and back sides of the solution nozzle 51. With this arrangement, flows of gas can be applied from the four directions to the spray of the fluorescent material-containing solution 30a sprayed from the solution nozzle 51 to alter the direction of the discharged spray.

In order to alter the direction of the spray at a spray angle $\theta_2$, at least one gas nozzle 52 is placed at the surroundings of the solution nozzle 51 so that the flow of the gas can be applied to the spray from at least one direction among the four directions. As shown in FIG. 3B, placing the gas nozzles 52 in the four directions corresponding to the movable directions of the solution nozzle 51, that is, the x-direction and the y-direction allows for a minute adjustment of the spray angle $\theta_2$ of the spray.

Figure 4A:
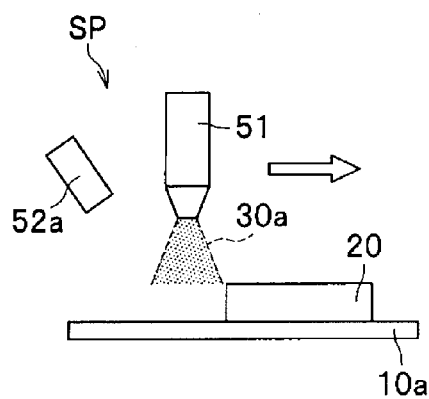
Figure 4B:
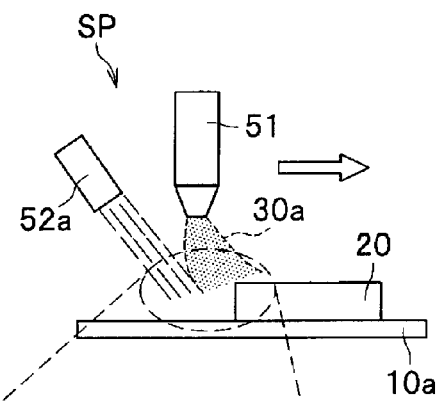
Figure 4C:
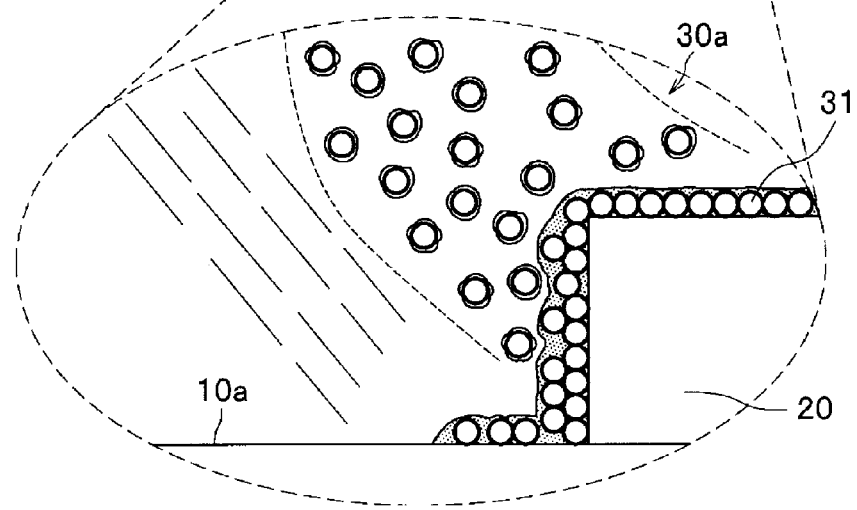

The installation angle $\theta_1$, the height, the gas pressure, ON/OFF status of the gas discharging can be individually controlled at each gas nozzles 52a, 52b, 52c, and 52d shown in FIG. 3B, which are to be considered as parameters related to a direction of the movement of the solution nozzle 51. For example, as shown in FIG. 4A, in the case where the fluorescent material-containing solution 30a is to be applied thick to a forward surface of the LED chip 20 which is at the direction of movement of the solution nozzle 51 (rightward in FIG. 4A, indicated by the hollow arrow), as shown in FIG. 4B, a gas is sprayed from the gas nozzle 52a placed at the left side of the solution nozzle 51. With this arrangement, as shown in FIG. 4C, an increased amount of the fluorescent material-containing solution 30a can be adhered on the forward surface of the LED chip 20.

As shown in FIG. 3B, the solution nozzle 51 described above can be freely moved in a left, right, back, and front directions (x-direction and y-direction) as shown in FIG. 3B. Thus, by synchronizing the spraying of the gas flow through the gas nozzle 52 with the movement of the solution nozzle 51, the fluorescent material can be disposed thick on the surfaces of the LED chip easily and efficiently. Also, for example, changing the shape of the discharge port of the gas nozzle 52 allows spraying of the fluorescent material-containing solution 30a only to a specific area with a spray angle of $\theta_2$.

Also, particularly, the fluorescent material is difficult to adhere to the side surfaces of the light transmissive member 40 and the surfaces near the substrate member 10a, which may result in irregular thickness of the fluorescent material layer 30 at the upper surface and the side surfaces of the light transmissive resin member 40, which tends to create color unevenness of the emission. For this reason, with the use of a gas, the direction of the spray is altered by a spray angle $\theta_2$, and further, the range of movement of the solution nozzle 51 is expanded larger than the range of the surface of the light transmissive resin member 40, to facilitate adhesion of the fluorescent material.

Applying the spray coating can be carried out, by using a spray coating machine having a structure as described below, the fluorescent material-containing solution 30a is sprayed by a solution nozzle 51 placed above the LED chip 20, and as a spraying direction of the fluorescent material-containing solution 30a indicating a central axis A, with using a gas nozzle placed in surrounding of the solution nozzle 51, spraying a gas toward the central axis A to alter the direction of the spray made of the fluorescent material-containing solution 30a.

It is preferable that in the spray coating, the gas nozzle 52 of the spray coating machine SP is configured to move integrally with the solution nozzle, so that the gas is discharged while the gas nozzle 52 is in synchronizing the movement of the solution nozzle 51. With this arrangement, the gas nozzle 52 synchronizes the movement of the solution nozzle 51, so that the flow of gas can be applied appropriately to the spray of the fluorescent material-containing solution 30a discharged from the solution nozzle 51. Now, return to continue the description of the manufacturing steps.

Figure 5:
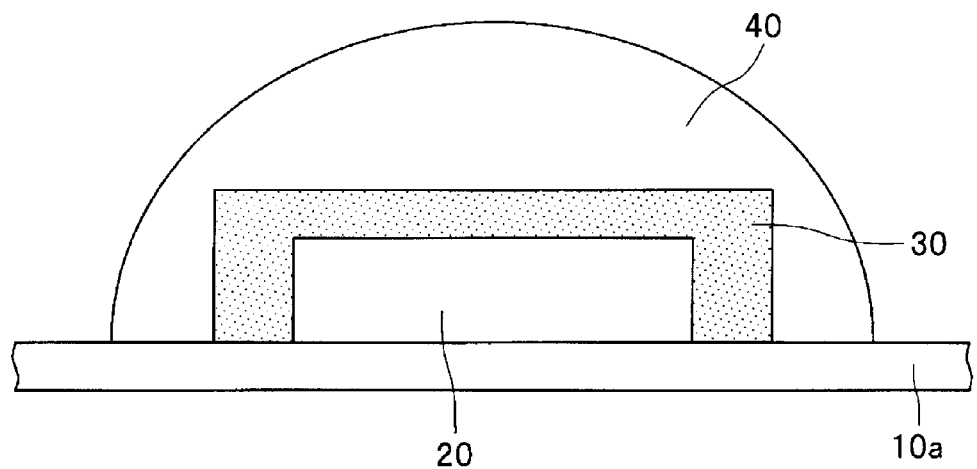
FIG. 5 is a schematic diagram illustrating a state after applying a resin coating according to a method of manufacturing alight emitting device according to an embodiment of the present invention.

Applying a resin covering is, as shown in FIG. 5, performed after the spray coating, on the LED chips 20 mounted on the substrate member 10a before dicing, to enclose each LED chip 20 with a light transmissive resin member 40. In applying resin covering, more specifically, in order to enclose the fluorescent material layer 30 disposed on the upper surface and the side surfaces of each LED chip 20, disposing a light transmissive resin 40 in a lens shape, or forming a lens by using a mold and using a compression molding, or forming a resin frame to surround the fluorescent material layer 30 and applying a light transmissive resin 40 in the resin frame by potting using a potting method and forms a lens by surface tension.

Figure 6:
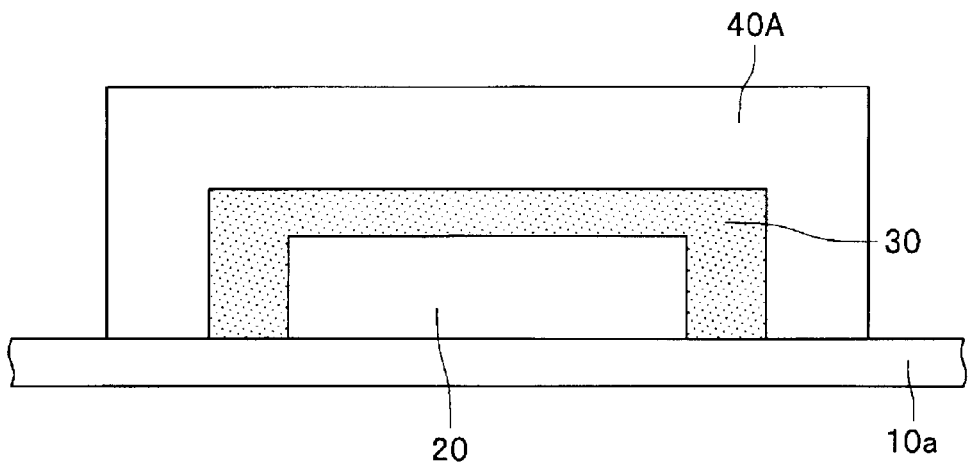
FIG. 6 is a schematic diagram illustrating an another example of a state after applying a resin coating is applied according to a method of manufacturing a light emitting device according to an embodiment of the present invention.

In the method of manufacturing the light emitting device 1 according to an embodiment, applying of resin covering as described above allows protecting of the LED chips 20 from dust, moisture, and external force etc. In applying of resin covering, other than the light transmissive resin member 40, a non-light transmissive resin containing a diffusion agent and/or a filler material may be used to enclose the LED chips 20. In applying of resin covering, as shown in FIG. 5, the light transmissive resin member 40 is formed in a lens shape, but as shown in FIG. 6, a rectangular shape may be employed.

Figure 7:
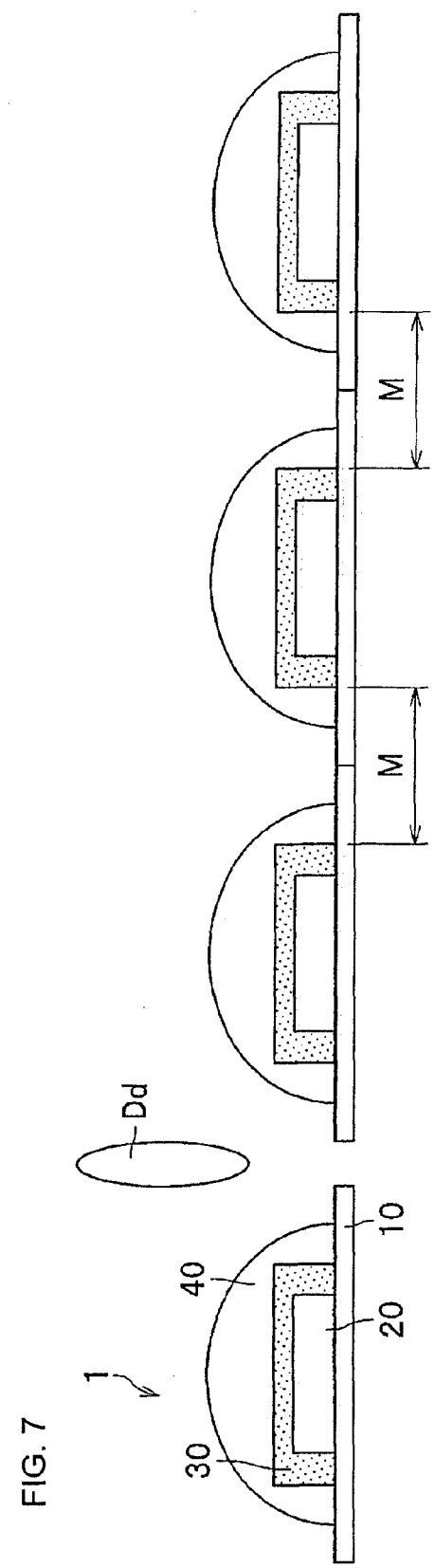
FIG. 7 is a schematic diagram illustrating dicing in a method of manufacturing a light emitting device according to an embodiment of the present invention.

In dicing, as shown in FIG. 7, using a dicing device Dd, the substrate member 10a is cut to divide each individual light emitting device 1.

In the case where disposing of mask is performed after mounting of LED chip, and removing of mask is performed after spray coating, in the disposing of mask, a mask for exposing at least the LED chip 20 is arranged on the substrate member 10a. At this time, masking region is, for example, arranged on the surface of the substrate member 10 indicated with "M" in FIG. 7, to surround the non-masking region. Then, in removal of mask, the mask disposed on the substrate member 10a is removed after spray coating. In the method of manufacturing the light emitting device 1 according to an embodiment, with the use of the mask as described above, the fluorescent material layer 30 (or a filler layer 60 (see FIG. 12) to be described below) can be formed at a desired location.

According to the method of manufacturing the light emitting device 1 and the spray coating machine SP used in the method as described above, in applying spray coating, a powder-containing solution (in some embodiments a fluorescent material-containing solution 30a) containing a powder such as a florescent material or a filler material is discharged as spraying through the solution nozzle 51, and the direction of spray of the powder-containing solution can be altered at an angle by spraying a gas through the gas nozzle 52.

Thus, according to the method of manufacturing a light emitting device 1 and a spray coating machine SP used in the method according to the embodiments, the direction of spray of the powder-containing solution can be altered at an angle by spraying a gas through the gas nozzle 52, so that a fluorescent material can be adhered efficiently on a coating object (corner portions or side surfaces of an LED chip 20, a surface of light transmissive resin member 40 having a lens shape, a surface of optical lens etc). With this arrangement, the method of manufacturing a light emitting device 1 and a spray coating machine (device) SP used in the method according to the embodiments can facilitate adjustment of the thickness of the fluorescent material, which allows controlling of the thickness of the fluorescent material inconformity to the light-distribution intensity of the LED chip to obtain a most suitable optical path length. Thus, generation of uneven color in the emission can be prevented.

Although a gas nozzle 52 is used in the spray coating machine SP in the embodiments of the invention, the solution nozzle 51 for discharging the fluorescent material-containing solution 30a can be placed at an angle to alter the direction of the spray at an angle without the use of the gas sprayed from the gas nozzle 52, but in the case where the solution nozzle 51 is placed at an angle, uneven distribution of the material (in some embodiments a fluorescent material-containing solution 30a) may occur due to the angle, which may result in abrasion and/or clogging of the solution nozzle 51. Occurrence of abrasion and/or clogging may lead difficulty of discharging of material from the solution nozzle 51, or further it may disable the discharging, thus, the thickness of the material becomes difficult to control.

On the other hand, as in the spray coating machine SP according to the embodiments of the present invention, with a combination of the gas nozzle 52, abrasion and/or clogging of the solution nozzle 51 can be prevented. Further, difficulty of discharging from the solution nozzle 51 can also be prevented, so that the thickness of the material can be adjusted easily. In the spray coating machine SP, even when the solution nozzle 51 is moving in front, back, left, and right, the solution nozzle 51 is always kept vertically, which allows stable spraying of the fluorescent material-containing solution 30a, and in addition the direction of the spray of the fluorescent material-containing solution 30a can be altered at an angle, so that a reliable spray angle $\theta_2$ can be obtained.

Light Emitting Device

A light emitting device according to an embodiment of the present invention will be described with reference to FIG. 8 and FIG. 8. The light emitting device 1 can be used, for example in the field of general lighting, as LED bulbs, spotlights, and street lights. The light emitting device 1 in the present embodiment at least includes, as shown in FIG. 8, a substrate member 10, an LED chip 20, a fluorescent material layer 30, and a light transmissive resin member 40.

The substrate member 10 is to mount the LED chip 20. The substrate member 10 is formed in a plate shape as shown in FIG. 8, and the LED chip 20 is mounted thereon. Also, on the substrate member 10, in addition to the LED chip 20, a part of a fluorescent material layer 30 and a part of a light transmissive resin member 40 covering the LED chip 20 are also disposed.

The substrate member 10 is, for example, formed with a circuit substrate or a lead frame, and are electrically connected to the LED chip 20 via a bonding member. Although not shown in the drawings, on the substrate member 10, a protective element for protecting the LED chip from electrostatic breakdown etc., maybe disposed on the substrate member 10. The LED chip 20 shown in FIG. 8 is assumed to be a flip-chip type, but a surface-mount type may also be used. In this case, a wire is provided to establish electric connection between the substrate member 10 and the LED chips 20.

The LED chip 20 can be made of, for example, a gallium nitride-based compound semiconductor, and with an application of voltage, can generate spontaneous luminescence which excites the fluorescent material. In the LED chip 20, for example shown in FIG. 8, the fluorescent material layer 30 coated by using the spray coating machine SP described above, is formed on the upper surface and the side surfaces.

The LED chip 20 can be made of a gallium nitride-based compound semiconductor as described above, and a material such as sapphire, SiC, Si, ZnO, or GaN can be typically used for the semiconductor substrate. For example, in the case of LED chips 20 having a sapphire substrate, the electrodes are disposed on the semiconductor layer by using sputtering method or vacuum deposition method, then, using a dicing machine equipped with a diamond dicing blade, full-cut or half-cut is performed to apply an external force on the wafer to cleave into individual LED chips 20.

For the LED chip 20, an appropriate wavelength can be selected according to the usage. For example, for the light emitting element 20 for emitting blue light (light of wavelength 430 nm to 570 nm), a nitride-based semiconductor ($In_xAl_yGa_{1-x-y}N$, $0 \leq X$, $0 \leq Y$, $X+Y \leq 1$) can be employed.

The fluorescent material layer 30 is for converting the wavelength of light emitted from the LED chip 20 to a different wavelength. The fluorescent material layer 30 is, as shown in FIG. 8, disposed on the upper surface and the side surfaces of the LED chip 20. The fluorescent material layer 30 is disposed without gaps even at the corner portions between the upper surface and the side surfaces of the LED chip 20, and thus the fluorescent material layer 30 is disposed on the periphery of the LED chip 20 except for the lower surface of the LED chip 20.

Figure 8:
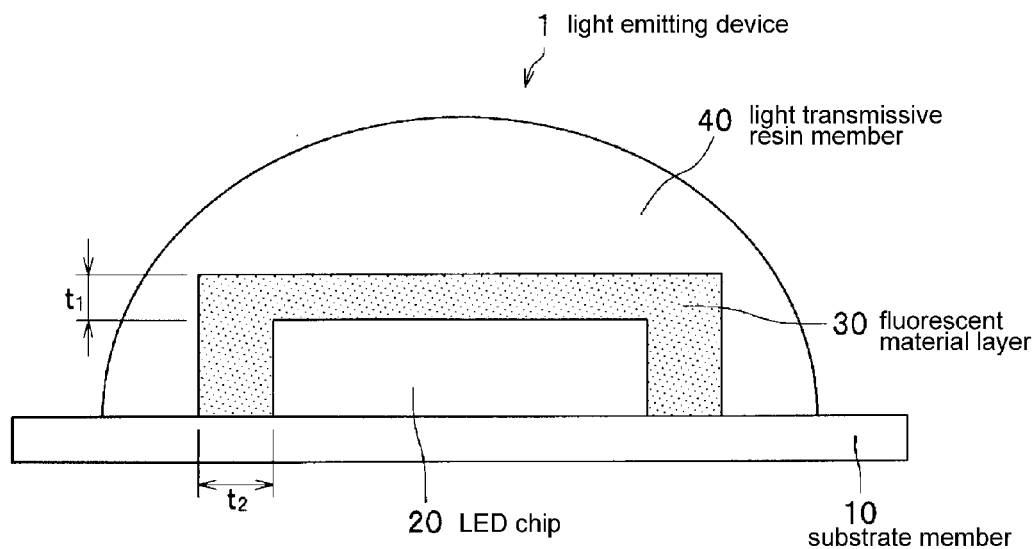
FIG. 8 is a cross sectional view showing an overall structure of a light emitting device according to a first embodiment of the present invention.

In the case of flip-chip type LED chips 20 are used as shown in FIG. 8, the fluorescent material layer 30 is disposed so that the thickness $t_2$ of the fluorescent material layer disposed on the side surfaces of the LED chip 20 is larger than the thickness $t_1$ of the fluorescent material layer disposed on the top surface of the LED chip 20. The fluorescent material layer 30 is disposed so that the thickness $t_1$ and thickness $t_2$ satisfy a ratio of, for example, 1:1.2 to 6. The ratio is determined in consideration of directional light intensity of the case where an emission is obtained without disposing the fluorescent material layer 30 on the flip-chip type LED chip 20. For example, in the case of surface-mount type LED chips 20, the fluorescent material layer 30 is disposed so that the ratio of the thickness $t_1$ to the thickness $t_2$ to be in a range of 1:0.6 60 3, for example.

The fluorescent material used for the fluorescent material layer 30 is, more specifically made up of a fluorescent material powder and an adhesive agent for adhering the fluorescent material powder with each other. Examples of the fluorescent material include, a YAG-based fluorescent material activated mainly with lanthanoid elements such as Ce, and a nitride-based fluorescent material or oxynitride-based fluorescent material, activated mainly with a lanthanoid element such as Eu, Ce. Examples of adhesive agent include light transmissive inorganic members such as $SiO_2$, $Al_2O_3$, $MSiO_3$ (where M indicates Zn, Ca, Mg, Ba, Sr, Ze, or Y).

For example, a YAG-based fluorescent material is used for the fluorescent material contained in the fluorescent material layer 30, and a blue LED chip is used for the LED chip 20, a white light can be generated by mixing the colors of light emitted from the both. The particle diameter of the fluorescent material may be in a range of 5 μm to 30 μm.

Figure 9:
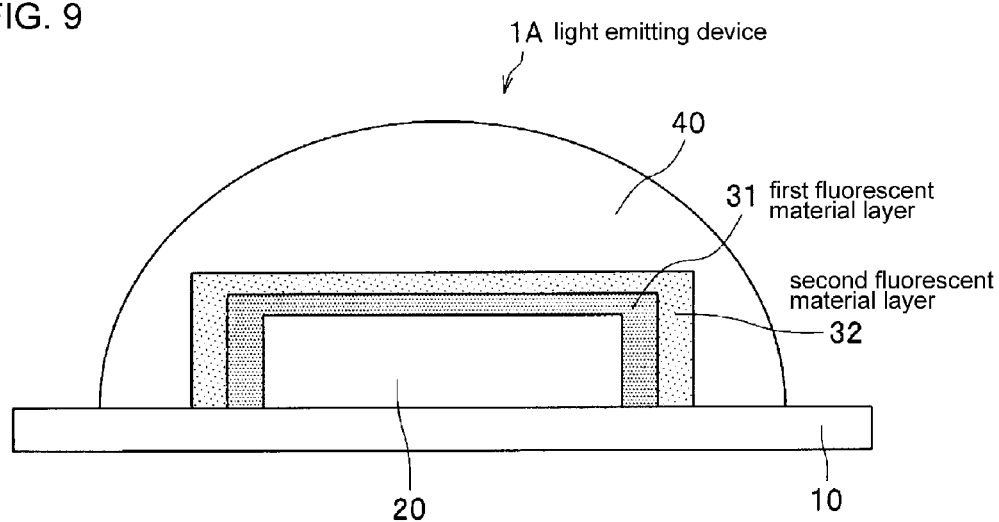
FIG. 9 is a cross sectional view showing an overall structure of a light emitting device according to a second embodiment of the present invention.

The fluorescent material is not limited to one kind as shown in FIG. 8, and two or more kinds may be used. For example, as the light emitting device 1A shown in FIG. 9, using spray coating method, first, a first fluorescent material layer 31 is disposed adhered to the LED chip 20, and next, a second fluorescent material layer 32 is disposed adhered to the first fluorescent material layer 31, thus, the fluorescent material layer of a two-layer structure can be formed. The configuration described above can be advantageous when two or more kinds of fluorescent materials with different excitation wavelengths are coated. The wavelength of a part of the light emitted from the LED chip 20 is converted at the fluorescent material layer 31, and the wavelengths of a part of the light emitted from the LED chip 20 and a part of the wavelength converted light at the fluorescent material layer 31 are converted at the second fluorescent material layer 32. With this arrangement, improvement in color rendering properties and adjustment of color tone of the emission can be facilitated.

In the present embodiment, a fluorescent material is exemplified, but a filler material (e.g. reflective material) can be used alternative to the fluorescent material. Examples of the filler material include inorganic compounds such as a silica-based filler material, an alumina-based filler material, or a titanium oxide-based filler material. Such a filler material is arranged in the vicinity of the LED chip 20 to form a filler layer alternative to the fluorescent material layer 30 as described above, diffusion of light emitted from the LED chip 20 can be expected.

The light transmissive resin member 40 is for protecting the LED chip 20 or the like arranged on the substrate member 10 from dust, moisture, and external force etc. The light transmissive resin member 40 is, for example as shown in FIG. 8, disposed on the substrate member 10 in a lens shape (hemispherical shape), to enclose the entire portion of the LED chip 20 and the fluorescent material layer 30 except for the bottom surfaces of those. With the use of the light transmissive resin member 40, a difference in the refractive index between the sapphire substrate of the LED chip 20 and the air layer can be reduced. Also, forming the light transmissive resin member 40 in a lens shape as shown in FIG. 8 allows to prevent total reflection in the light transmissive resin member 40, so that the light extraction efficiency can be improved. For the light transmissive resin member 40, for example, a light transmissive resin material having excellent weather resistance such as a silicone resin, an epoxy resin, or a urea resin can be used.

In the case where a flip-chip type LED chip is used as shown in FIG. 8, the light emitting device 1 having such structure as described above, in conformity to the directional light intensity of the LED chip 20 itself, the thickness of the light emitting member $t_2$ disposed on the side surfaces of the LED chip than the thickness $t_1$ of the fluorescent material disposed on the upper surface of the LED chip 20. Accordingly, in the light emitting device 1, irregularity of color tone due to a difference in the length of the optical path, caused by a difference in the thickness of the fluorescent material layer 30 can be prevented.

As illustrated above, specific examples of a method of manufacturing light emitting device and a spray coating machine used in the method according to the embodiments was shown above. However, aspects of the present invention are not limited to those described. Accordingly, the scope and spirit of the invention should be appreciated broadly based on the following claims. Also, obviously, numerous modifications and variations of the present invention are possible in light of the above teachings, which are within the scope and spirit of the invention, and such other modifications and variations are intended to be covered by the following claims.

Figure 10:
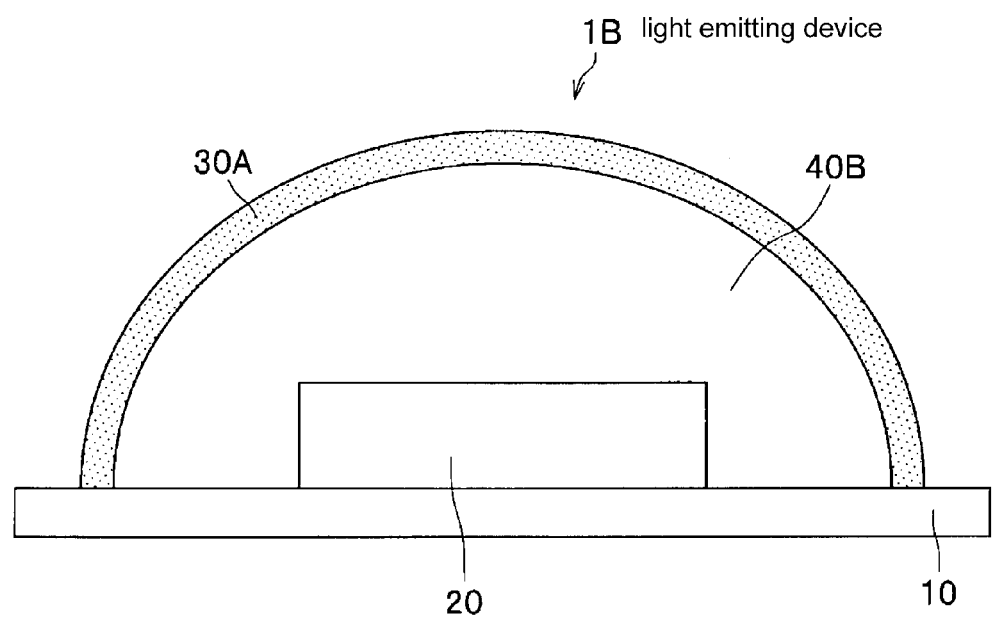
FIG. 10 is a cross sectional view showing an overall structure of a light emitting device according to a third embodiment of the present invention.
Figure 11:
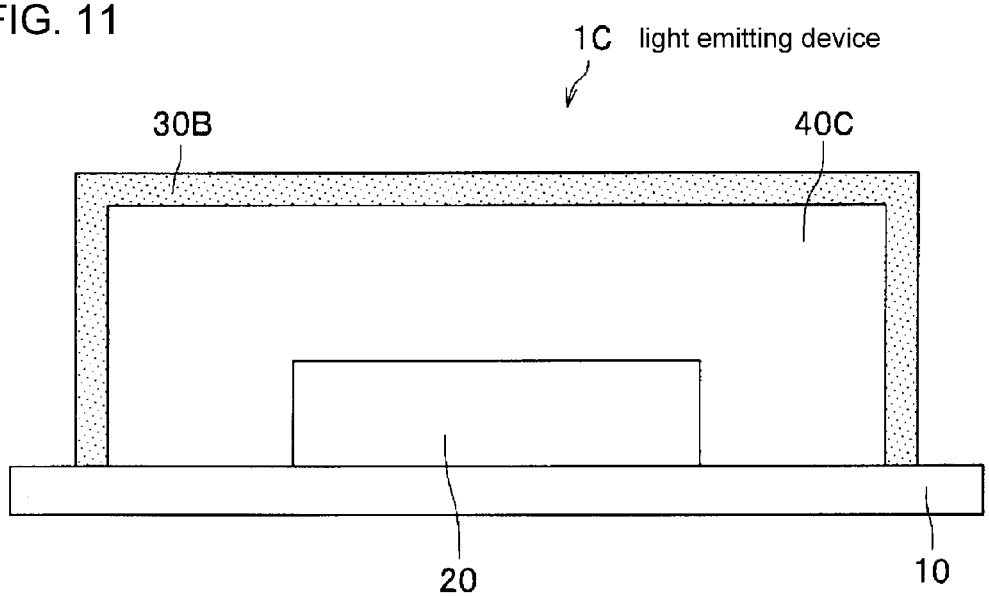
FIG. 11 is a cross sectional view showing an overall structure of a light emitting device according to a fourth embodiment of the present invention.

For example, it may be such that, as the light emitting device 1B shown in FIG. 10, an LED chip 20 is mounted on a substrate member 10 and enclosed with a light transmissive resin member 40B having a lens shape. Then, a fluorescent material layer 30A is disposed on the surface of the light transmissive resin member 40B by using the spray coating machine SP. Or, it may be such that, as the light emitting device 1C shown in FIG. 11, an LED chip 20 is mounted on a substrate member 10 and enclosed with a light transmissive member 40C having a rectangular shape. Then, a fluorescent material layer 30B is disposed on the surface of the light transmissive resin member 40C by using the spray coating machine SP. In the cases described above, the coating objects of the fluorescent material-containing solution 30a supplied by the spray coating machine SP are not the LED chip 20 as shown in FIG. 8 but are the light transmissive resin member 40B, 40C.

Figure 12:
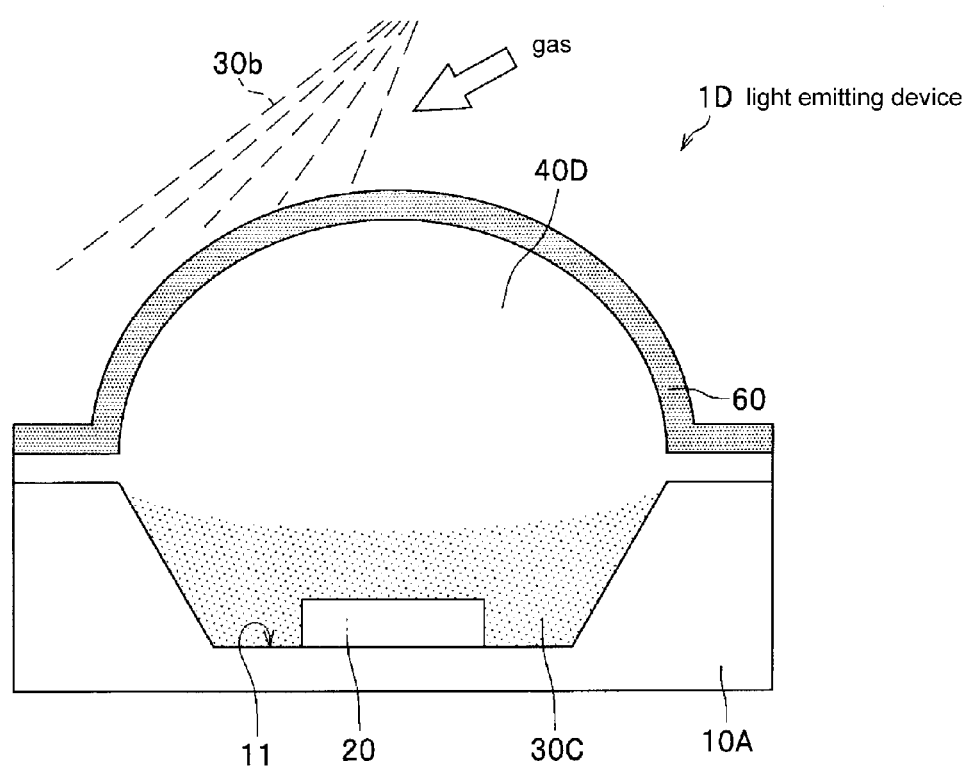
FIG. 12 is a cross sectional view showing an overall structure of a light emitting device according to a fifth embodiment of the present invention.

Also, as the light emitting device 1D shown in FIG. 12, a structure in which a filler layer 60 is disposed on the surface of the light transmissive resin member 40D can be employed. That is, in the light emitting device 1D, the LED chip 20 is mounted on the substrate member 10A defining a recess 11. Also, in the light emitting device 1D, a liquid resin containing a fluorescent material is applied in the recess 11 of the substrate member 10A, to dispose a fluorescent material layer 30C. Further, in the light emitting device 1D, on the surface of the light transmissive resin member 40D having a lens shape, a filler solution 30b is sprayed by using the spray coating machine SP, and a filler layer 60 is disposed with a substantially uniform thickness. In this case, the coating object of the filler solution by using the spray coating machine SP is the light transmissive resin member 40D.

Further, in the method of manufacturing the light emitting devices 1, 1A, 1B, 1C, and 1D, according to the embodiments, the height of the outlet port (not shown) of the gas nozzle of the spray coating machine SP is preferably placed lower than the height of the outlet port (not shown) of the solution nozzle 51. With this arrangement, according to the method of manufacturing the light emitting devices 1, 1A, 1B, 1C, and 1D of the embodiments, outlet port of the gas nozzle 52 is placed lower than the outlet port of the solution nozzle 51, which can facilitates application of gas flow to the spray of the powder-containing solution (the fluorescent material-containing solution 30a or the filler solution 31b) discharged from the solution nozzle 51.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a light emitting device at least including an LED chip and a substrate member disposed with the LED chip, the method comprising:
   mounting an LED chip on a substrate member;
   applying a spray coating to a coating object including the LED chip by spraying a powder-containing solution containing a powder by using a spray;
   wherein the applying a spray coating comprises: spraying the powder-containing solution through a solution nozzle placed above the coating object, and as a spraying direction of the powder-containing solution indicating a central axis, using a gas nozzle arranged in a surrounding relationship to the central axis, spraying a gas toward the central axis to alter an direction of the spray made of the powder-containing solution.

2. The method of manufacturing a light emitting device according to claim 1, wherein the applying a spray coating comprises; through the air nozzle, spraying the gas from at least one direction among four directions toward the central axis to adhere the powder-containing solution on a surface of the LED chip.

3. The method of manufacturing a light emitting device according to claim 1, wherein the applying a spraying coating comprises; through the gas nozzle, spraying the gas toward the central axis at an angle of 10° to 45° with respect to the central axis.

4. The method of manufacturing a light emitting device according to claim 2, wherein the applying a spraying coating comprises; through the gas nozzle, spraying the gas toward the central axis at an angle of 10° to 45° with respect to the central axis.

5. The method of manufacturing a light emitting device according to claim 1, wherein in the applying a spray coating, a gas outlet of the gas nozzle is arranged lower than a solution outlet of the solution nozzle.

6. The method of manufacturing a light emitting device according to claim 2, wherein in the applying a spray coating, a gas outlet of the gas nozzle is arranged lower than a solution outlet of the solution nozzle.

7. The method of manufacturing a light emitting device according to claim 1, wherein the applying a spray coating comprises; spraying the gas while the gas nozzle being synchronized with an action of the solution nozzle.

8. The method of manufacturing a light emitting device according to claim 2, wherein the applying a spray coating comprises; spraying the gas while the gas nozzle being synchronized with an action of the solution nozzle.

9. The method of manufacturing a light emitting device according to claim 4, wherein the applying a spray coating comprises; spraying the gas while the gas nozzle being synchronized with an action of the solution nozzle.

10. The method of manufacturing a light emitting device according to claim 1, wherein the powder contained in the powder-containing solution is a fluorescent material.

11. The method of manufacturing a light emitting device according to claim 8 wherein the powder contained in the powder-containing solution is a fluorescent material.

12. The method of manufacturing a light emitting device according to claim 1, wherein the powder contained in the powder-containing solution is a filler material.

13. The method of manufacturing a light emitting device according to claim 8, wherein the powder contained in the powder-containing solution is a filler material.

14. The method of manufacturing a light emitting device according to claim 1, further comprising, between the mounting an LED chip and the applying a spray coating, disposing a mask on the substrate member to expose at least the LED chip, and after the applying a spray coating, removing the mask disposed on the substrate member.

15. The method of manufacturing a light emitting device according to claim 1, further comprising, after the applying a spray coating, applying a resin covering to cover the LED chip mounted on the substrate member with a light transmissive resin member.

16. A spray coating machine to spray a fluorescent material-containing solution to an LED chip comprising:
- a solution nozzle arranged above the LED chip to spray a fluorescent material-containing solution above the LED chip; and
- a gas nozzle arranged in a surrounding relationship to the central axis, as a spraying direction of the powder-containing solution indicating a central axis, to spray a gas toward the central axis to alter an direction of the spray made of fluorescent material-containing solution.

17. The spray coating machine according to claim 16, wherein the gas nozzle is placed in each of four directions with respect to the central axis.

18. The spray coating machine according to claim 16, wherein the gas nozzle sprays the gas toward the central axis at an angle of 10° to 45° with respect to the central axis.

19. The spray coating machine according to claim 16, wherein a gas outlet of the gas nozzle is placed lower than a solution outlet of the solution nozzle.

20. The spray coating machine according to claim 16, wherein the gas nozzle can move integrally with the solution nozzle.

* * * * *